US011099211B1

(12) United States Patent
Najafi et al.

(10) Patent No.: US 11,099,211 B1
(45) Date of Patent: Aug. 24, 2021

(54) CRYOGENIC PROBE CARD

(71) Applicant: PsiQuantum Corp., Palo Alto, CA (US)

(72) Inventors: Faraz Najafi, Palo Alto, CA (US); Andrea Bahgat Shehata, Mountain View, CA (US); Stephanie Meng-Yan Teo, Santa Clara, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 115 days.

(21) Appl. No.: 16/659,535

(22) Filed: Oct. 21, 2019

Related U.S. Application Data

(60) Provisional application No. 62/906,680, filed on Sep. 26, 2019, provisional application No. 62/751,594, filed on Oct. 27, 2018.

(51) Int. Cl.
    *G01R 31/28* (2006.01)
    *G01R 1/073* (2006.01)
    *F25D 29/00* (2006.01)

(52) U.S. Cl.
    CPC ....... *G01R 1/07342* (2013.01); *F25D 29/001* (2013.01); *G01R 31/2889* (2013.01)

(58) Field of Classification Search
    CPC .............. G01R 1/0466; G01R 31/2868; G01R 31/2874; G01R 31/2893; G01R 31/68; G01R 19/257; G01R 31/2884; G01R 31/3004; G01R 31/3181; G01R 31/31813; G01R 1/07307; G01R 1/07342
    See application file for complete search history.

(56) References Cited

U.S. PATENT DOCUMENTS

2007/0204610 A1* 9/2007 Hatta ................ H01L 21/67103
                                                            60/520
2013/0278279 A1* 10/2013 Ishii .................... G01R 1/07342
                                                          324/750.03

\* cited by examiner

*Primary Examiner* — Tung X Nguyen
(74) *Attorney, Agent, or Firm* — Morgan, Lewis & Bockius LLP

(57) ABSTRACT

The various embodiments described herein include methods for testing low temperature components. In some embodiments, a cryogenic testing system includes: (1) a cryostat chamber configured to maintain a sample at temperatures below a threshold temperature, where the sample includes a two-dimensional array of components to be tested, the two-dimensional array comprising a first number (n) of columns and a second number (m) of rows; (2) a probe card including: (a) a set of n column connectors configured to couple to respective columns of the two-dimensional array; and (b) a set of m row connectors configured to couple to respective rows of the two-dimensional array; and (3) a cryogenic connector for communicatively coupling the probe card to a processing unit outside of the cryostat chamber.

19 Claims, 6 Drawing Sheets

CRYOGENIC PROBE CARD

RELATED APPLICATIONS

This application claims priority to U.S. Provisional Application No. 62/751,594, filed Oct. 27, 2018, entitled, "Cryogenic Probe Card," and U.S. Provisional Application No. 62/906,680, filed Sep. 26, 2019, entitled, "Superconducting Device with Asymmetric Impedance," each of which is hereby incorporated by reference in its entirety.

TECHNICAL FIELD

This relates generally to low temperature testing systems, including but not limited to, testing systems using cryogenic probe cards.

BACKGROUND

Superconductors are materials capable of operating in a superconducting state with zero electrical resistance under particular conditions. For example, some superconductors only operate in a superconducting state while maintained at temperatures below a threshold superconducting temperature (e.g., 4 Kelvin).

Testing superconductor devices, and other low temperature components, presents significant challenges. First, a cryostat chamber is generally employed to maintain the low temperatures. Each port to the cryostat chamber may also allow heat transfer, making the cryostat chamber less effective and/or efficient. Second, testing components, such as probe cards, that employ mechanical, movable probes are more likely to malfunction at the low temperatures.

SUMMARY

There is a need for more efficient and effective systems and methods for testing components at cryogenic temperatures. Such systems and methods optionally complement or replace conventional methods for testing components.

In one aspect, some embodiments include a cryogenic testing system that includes: (1) a cryostat chamber configured to maintain a sample at temperatures below a threshold temperature, wherein the sample includes a two-dimensional array of components to be tested, the two-dimensional array comprising a first number (n) of columns and a second number (m) of rows; (2) a probe card, comprising: (a) a set of n column connectors configured to couple to respective columns of the two-dimensional array; and (b) a set of m row connectors configured to couple to respective rows of the two-dimensional array; and (3) a cryogenic connector for communicatively coupling the probe card to a processing unit outside of the cryostat chamber. In some embodiments, the probe card is configured to: (i) selectively test individual components on the sample via row and column multiplexing; and (ii) output readout data to the processing unit via the cryogenic connector. In some embodiments, the cryogenic connector has less than n×m communication lines breaching the cryostat chamber.

In another aspect, some embodiments include a method that includes: (1) maintaining a sample at temperatures below a threshold temperature within a cryostat chamber, the sample having a plurality of components arranged in a two-dimensional array; and (2) while maintaining the sample at the temperatures below the threshold temperature: (a) testing an individual component of the plurality of components by utilizing a first connector coupled to a first row of the sample and a second connector coupled to a first column of the sample, wherein the individual component is within the first row and the first column; and (b) outputting a test result of testing the individual component to a processing unit arranged outside of the cryostat chamber.

Thus, more efficient, effective, and accurate systems and methods are provided for testing components at cryogenic temperatures.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Many superconductors require very low temperatures to operate in a superconducting state. However, testing and operating superconducting circuitry at these low temperatures can be challenging. Achieving temperatures near absolute zero (e.g., less than 10 Kelvin) often requires high performance cooling systems that are large and costly. In addition, it is difficult to maintain the near-zero temperatures due to high cooling power needed for reliable testing and operation of many superconducting circuits. Therefore, there is a need for testing systems that reduce or minimize thermal conductivity between the testing chamber and its environs. Moreover, there is a need for testing components that operate reliably at low temperatures (e.g., below 10 Kelvin).

Figure 1A:
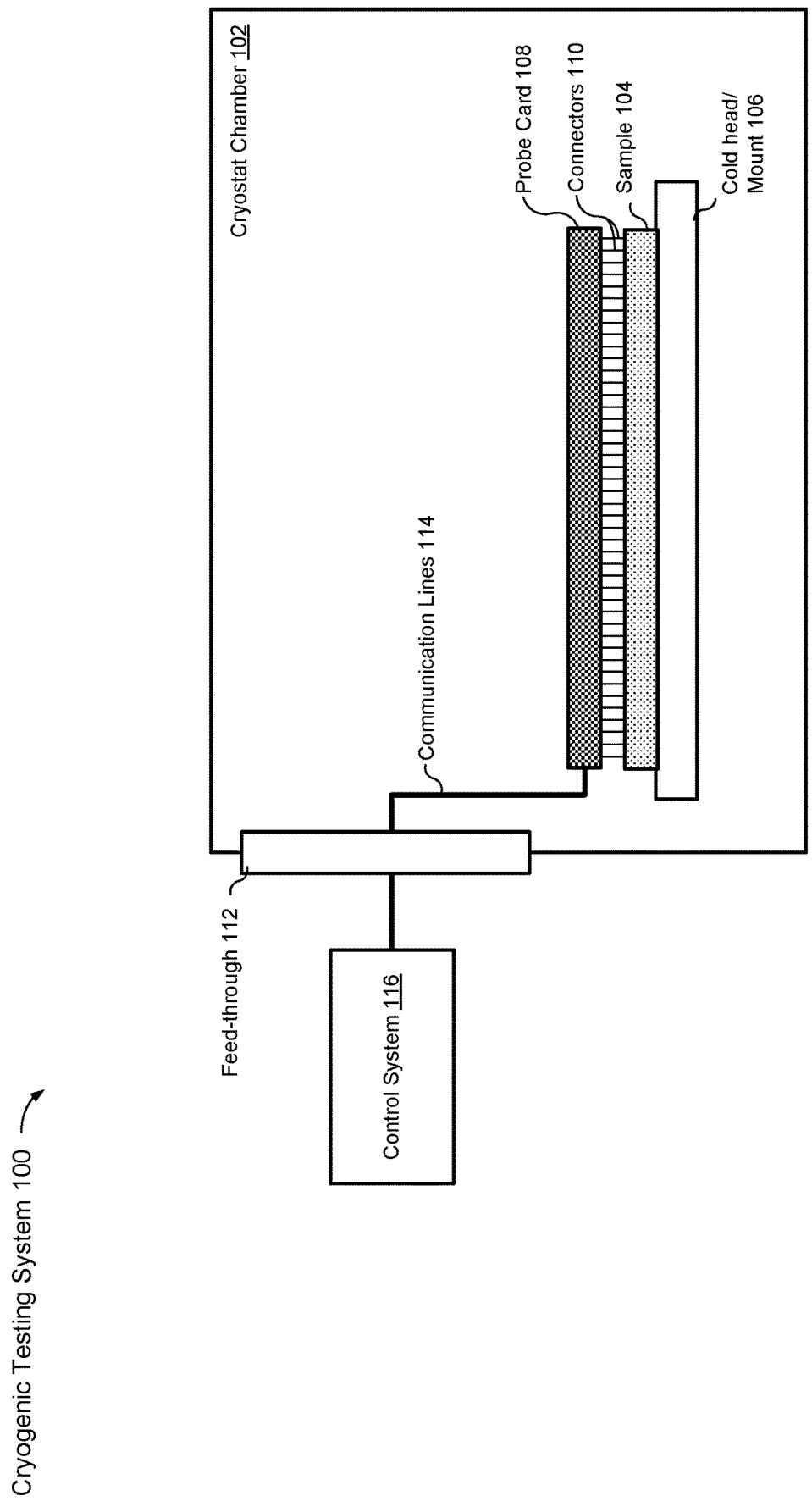
FIGS. 1A-1B are diagrams illustrating representative cryogenic testing systems in accordance with some embodiments.

FIG. 1A illustrates a cryogenic testing system 100 in accordance with some embodiments. The cryogenic testing system 100 includes a cryostat chamber 102 with a mount 106 therein. The sample 104 to be tested (e.g., a superconducting chip or wafer) is arranged on the mount 106 and is coupled to a probe card 108 via connectors 110 (e.g., row connectors, column connectors, and component connectors, as described below). The probe card 108 is communicatively coupled to a control system 116 outside of the cryostat chamber via communication lines 114 and a feed-through 112 (e.g., a cryogenic connector). In some embodiments, the probe card 108 includes electrical multiplexing without transistors or switches. In some embodiments, the control system 116 includes a switch matrix (not shown) to address and test individual components of the sample 104.

In some embodiments, the sample 104 includes a plurality of components to be tested, the plurality of components arranged in a two-dimensional array. For example, the sample 104 includes "m" rows of components and "n" columns of components. In some embodiments, components within a row of components (or optionally a column) on the sample 104 are coupled to one another. For example, a reference node of each component in a row of components is coupled together (e.g., by a wire 219, described below) such that the reference nodes can be driven by a single source. For example, the reference nodes may be all coupled to an electrical ground. In some embodiments, the number of connectors 110 is equal to "m" times "n" plus "c" (($m \times n$)+c), where "c" corresponds to connectors for reference nodes and/or voltage sources coupled to all components on the sample 104. In some embodiments, the probe card 108 also includes an additional connector for each row of components (i.e., m additional connectors, sometimes called row connectors), and in such embodiments the number of connectors 110 is equal to ($m \times (n+1)$)+c.

In some embodiments, the number of communication lines 114 between the probe card 108 and the feed-through 112 is less than a total number of components to be tested on the sample 104. In some embodiments, the number of communication lines 114 is less than the number of connectors 110 (e.g., feed-through 112 (e.g., the cryogenic connector) has less than $n \times m$ communication lines 114 leaving the cryostat chamber 102). For example, the number of communication lines 114 includes "m" lines for the "m" columns of components plus "n" lines for the "n" rows of components (and optionally additional lines for reference nodes of the sample 104, such as VCC or VDD). In some embodiments, "m" and "n" are both integers greater than 2 (e.g., the array of components includes at least three rows and three columns of components), and are typically integers greater than 3, or 4, or 5, or 7. In some embodiments, the number of communication lines is "m"+"n"+"c", where "c" corresponds to connectors for reference nodes or voltage sources coupled to all components on the sample 104 and is an integer less than 10, and typically is an integer less than 5, 4, or 3. Reducing a number of communication lines 114 reduces a thermal impact on the cryostat chamber 102 from exiting communication lines.

In some embodiments, the cryostat chamber 102 is configured to maintain interior temperatures below 50 Kelvin, 20 Kelvin, or 10 Kelvin. For example, the cryostat chamber is composed of thermally-insulated materials and liquid cryogen (e.g., liquid hydrogen and/or liquid helium) is used to reduce the temperature of the interior of the cryostat chamber. In some embodiments, the cryostat chamber 102 is configured to maintain a low pressure (e.g., vacuum) environment within the chamber. For example, a vacuum pump is coupled to the cryostat chamber 102 and utilized to reduce the interior pressure below 1000 particles per centimeter, 100 particles per centimeter, or 10 particles per centimeter. In some embodiments, the mount 106 comprises a cold head maintained at temperatures below a threshold temperature (e.g., below 10 Kelvin, 4 Kelvin, or 2 Kelvin). In some embodiments, the cold head is thermally-coupled to a liquid cryogen. In some embodiments, the sample 104 includes one or more superconducting components and the mount 106 is configured to maintain the superconducting components at temperatures below the components' respective superconducting threshold temperatures. In some embodiments, the control system 124 is positioned and configured to operate at higher temperatures than the interior of the cryostat chamber (e.g., temperatures above 10 Kelvin, 20 Kelvin, or 50 Kelvin). In some embodiments, the control system 116 is arranged and configured to operate at room temperatures. In some embodiments, the control system comprises a processing unit.

Figure 1B:
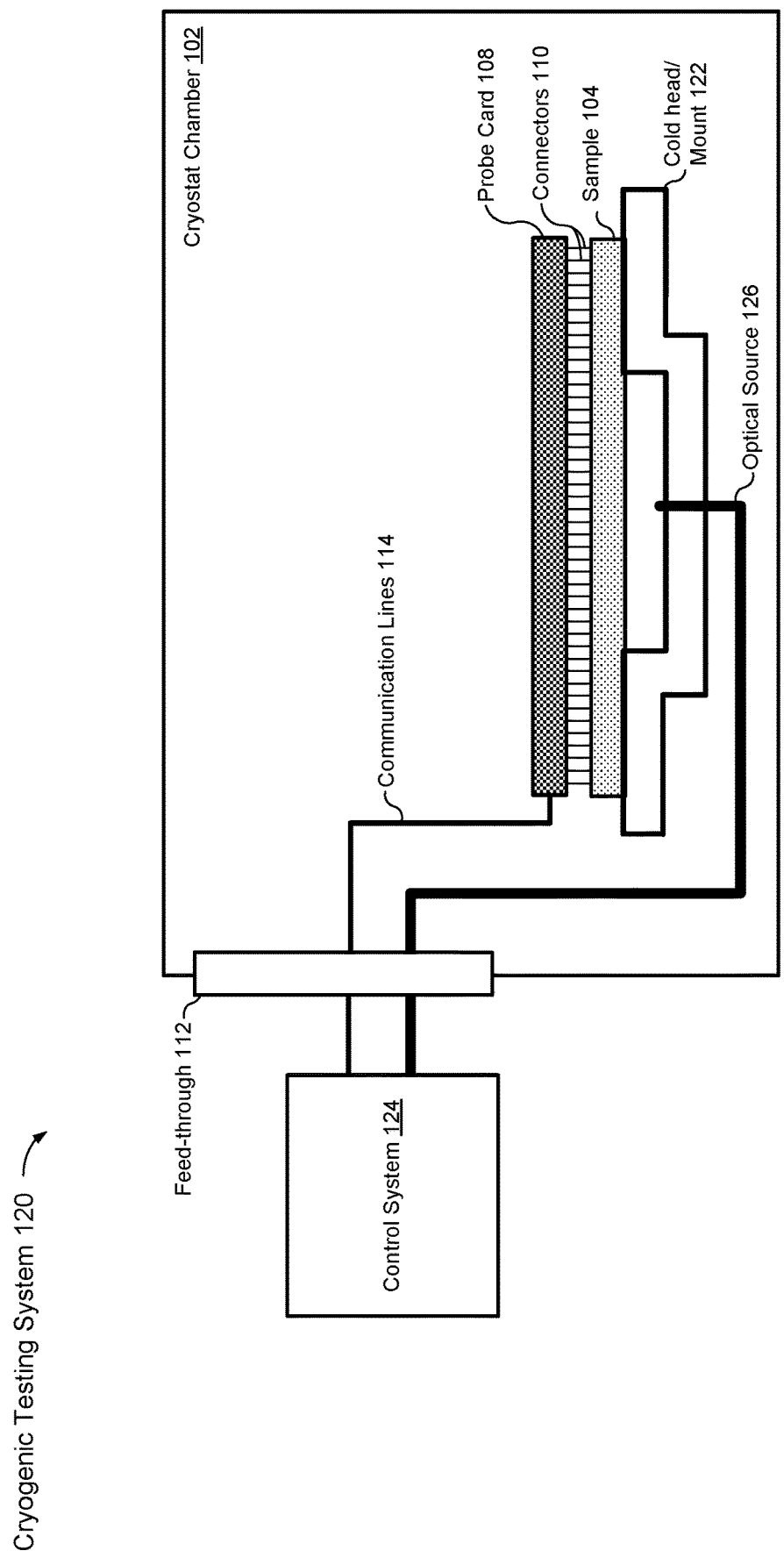

FIG. 1B illustrates a cryogenic testing system 120 in accordance with some embodiments. The cryogenic testing system 120 is similar to the cryogenic testing system 100 of FIG. 1A, however, the mount 106 in FIG. 1A is replaced with a mount 122, an optical source 126 is added, and the control system 116 is replaced with the control system 124. In some embodiments, the control system 124 includes the control system 116 and an optical control sub-system.

In accordance with some embodiments, the mount 122 includes an aperture for the optical source 126. In some embodiments, the mount 122 comprises a cold head maintained at temperatures below a threshold temperature (e.g., below 10 Kelvin, 4 Kelvin, or 2 Kelvin). In some embodiments, the cold head is thermally-coupled to a liquid cryogen. In some embodiments, the sample 104 includes one or more superconducting components and the mount 122 is configured to maintain the superconducting components at temperatures below the components respective superconducting threshold temperatures. In some embodiments, the cryostat chamber 102 includes one or more radiation shields (not shown).

In some embodiments, the optical source 126 includes one or more optical fibers. In some embodiments, the optical source 126 is configured and arranged to allow delivery of light to the sample 104. In some embodiments, the sample 104 includes a plurality of light-responsive components (e.g., photon detectors) and the optical source 126 is configured and positioned to provide light to each of the light-responsive components. In some embodiments, the optical source 126 is configured and positioned to provide light to each of the light-responsive components concurrently. In some embodiments, the control system 124 is programmed and/or configured to provide light to each of the light-responsive components via the optical source 126, and test the responses of the light-responsive components via the probe card 108 and communication lines 114. In some embodiments, the optical source 126 generates the light within the cryostat chamber 102 (e.g., in response to signals from the control system 124). In some embodiments, the control system 124 generates the light and transmits it via the optical source 126.

In some embodiments, the optical source 126 is configured to provide light of a wavelength for which a substrate of the sample 104 is transparent. For example, the sample 104 has a Silicon substrate and the optical source 126 is configured to provide light with a 1550 nm wavelength. In this manner, the light is able to pass through the substrate of the sample and be received by the light-responsive components of the sample 104.

Figure 2A:
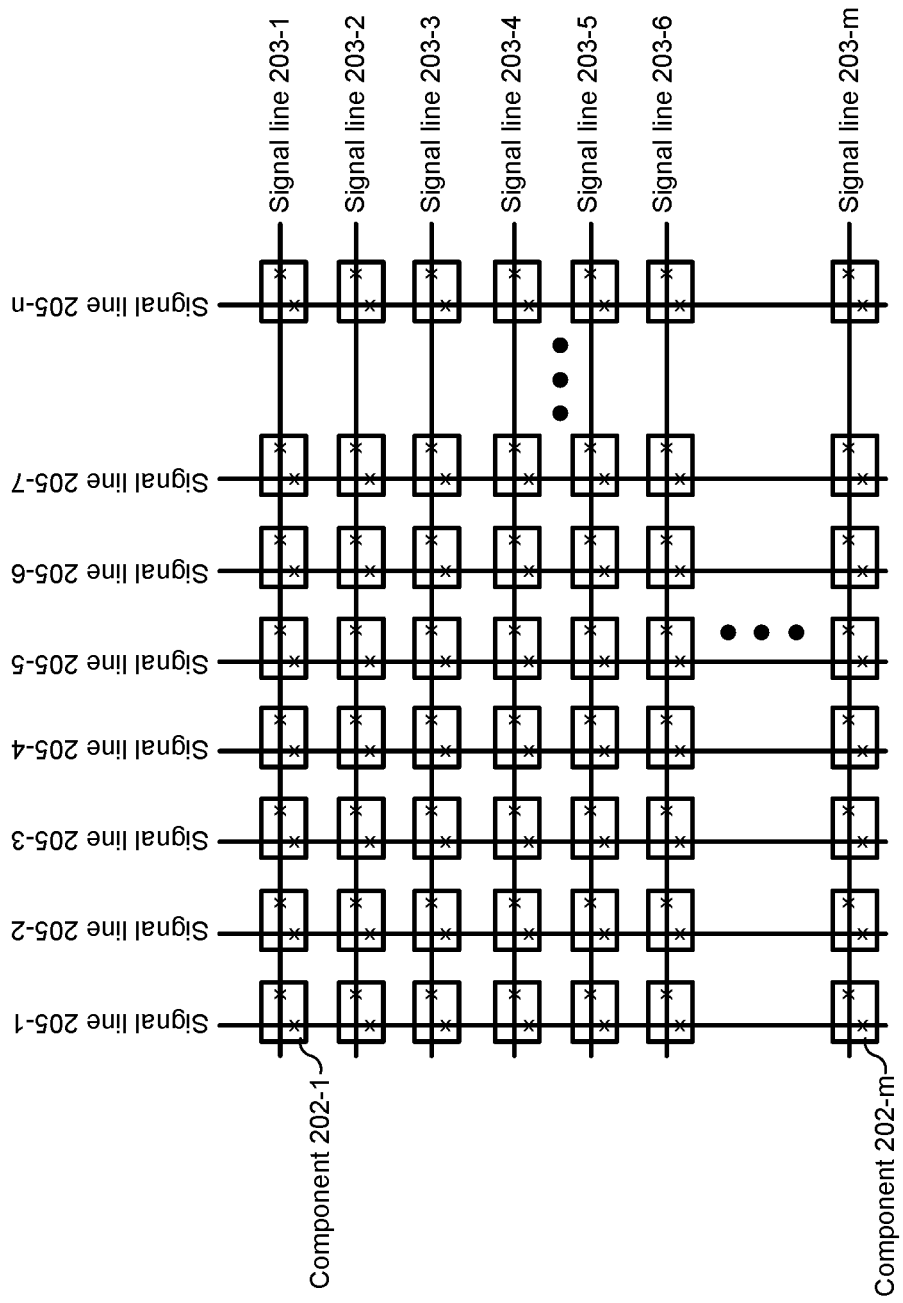
FIGS. 2A-2B are diagrams illustrating representative multiplexing schemes for use in the cryogenic testing system of FIG. 1A in accordance with some embodiments.
Figure 2B:
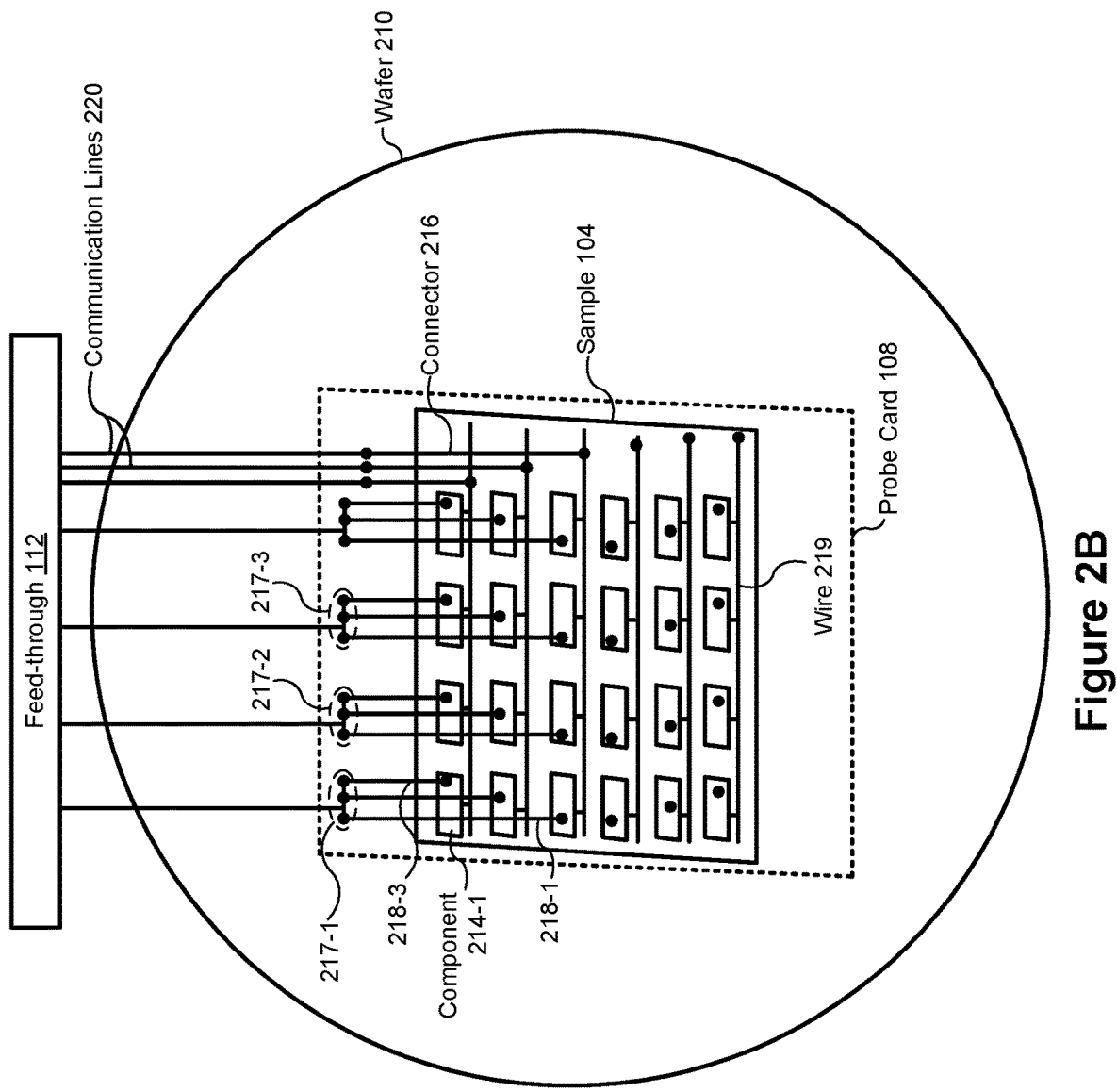

FIGS. 2A-2B are diagrams illustrating representative multiplexing schemes for use in the cryogenic testing systems of FIGS. 1A-1B in accordance with some embodiments. FIG. 2A shows a two-dimensional array of components 202 with "m" rows and "n" columns. Each component 202 within a particular row is coupled together via a signal line 203 (e.g., signal line 203-1, e.g., which may be embodied as a wire 219, FIGS. 2B-2C), and each component 202 within a particular column is coupled together via a signal line 205 (e.g., which may be embodied as a column connector 217, FIGS. 2B-2C). In some embodiments, the sample 104 includes a same number of columns and rows (e.g., "m" is equal to "n"), while in other embodiments, the sample 104 includes differing numbers of rows and columns. In some embodiments, the components 202 of the two-dimensional array are arranged in straight lines, while in other embodiments, the components 202 are arranged in a skewed pattern (e.g., the rows and/or columns are not straight). In some embodiments, each component 202 is a superconducting component that operates in a superconducting state only at temperatures below a threshold temperature (e.g., below 20 Kelvin, 10 Kelvin, or 4 Kelvin). In some embodiments, each component 202 includes a light-sensitive element, such as a photon detector. In some embodiments, each component 202 includes a superconducting nanowire single-photon detector (SNSPD).

In some embodiments, the signal lines 203 are, or include, superconducting wires. In some embodiments, the signal lines 203 are routed on the sample 104 (e.g., as wires 219, FIGS. 2B-2C, each coupled to the probe card through a row connector 216). In some embodiments, the signal lines 203 are routed on the probe card 108 (e.g., by a connector 110 (e.g., a component connector or "probe pin") for each component to be coupled to the signal line). In some embodiments, each signal line 203 is coupled to a reference node of each component 202. In some embodiments, the probe card 108 is configured to selectively drive each signal line 203 to a particular voltage (e.g., a voltage corresponding to an electrical ground). In some embodiments, each signal line 203 is coupled to an output terminal of each component 202.

In some embodiments, the signal lines 205 are, or include, superconducting wires. In some embodiments, the signal lines 205 are routed on the sample 104. In some embodiments, the signal lines 205 are routed on the probe card 108 (e.g., by a connector 110 (e.g., a component connector or "probe pin") for each component to be coupled to the signal line). In some embodiments, each signal line 205 is coupled to a reference node of each component 202 in the column of components corresponding to that signal line 205. In some embodiments, the probe card 108 is configured to selectively drive each signal line 205 to a particular voltage (e.g., a voltage corresponding to an electrical ground). In some embodiments, each signal line 205 is coupled to an output terminal of each component 202 in the column of components corresponding to that signal line 205.

As an example, testing component 202-1 includes: (1) enabling operation of the component 202-1 by driving the signal lines 203-1 (e.g., setting the signal line 203-1 to a particular voltage) and 205-1 (e.g., setting the signal line 205-1 to electrical ground); and then (2) reading an output of the component 202-1 by obtaining a signal on one or more of the signal lines 203-1 or 205-1 (e.g., measure a current of the component 202-1).

FIG. 2B shows a wafer 210 (e.g., a silicon wafer) having the sample 104 thereon. FIG. 2B also shows the probe card 108 positioned above the sample 104. Row connectors 216 (e.g., "m" row connectors 216 for "m" rows of components 214), column connectors 217 (e.g., "n" column connectors 217 for the "n" columns of components 214), and component connectors 218 (e.g., up to "m"×"n" component connectors for the array of components 214) couple the sample 104 to the probe card 108 (e.g., by electrically-coupling the components 214 of the sample 104 to the probe card 108). Component connectors 218 are sometimes called probes, or probe pins. In some embodiments, probe card 108 further includes a small number (e.g., typically 4 or less) of additional connectors (not shown in FIGS. 2A and 2B) for reference nodes of the sample 104, such as for providing one or more reference voltage signals, sometimes called VCC, VDD, ground, and the like to the components 214 of the sample. FIG. 2B further shows communication lines 220 coupling the probe card 108 to the feed-through 112. In some embodiments, the communication lines 220 are the communication lines 114 in FIG. 1A. In some embodiments, each column connector 217 is configured to be coupled to m (or up to m) component connectors 218 that make physical contact with respective components in the m rows of components.

In some embodiments, the row connectors 216 are positioned and configured to couple to rows of the components 214 (e.g., are positioned and configured to couple to the signal lines 203 in FIG. 2A). In some embodiments, the components 214 along a respective row are coupled by a wire 219 on the sample 104 (e.g., the wire 219 is configured to be electrically and communicatively coupled with a respective row connector 216). For example, the components 214 along each respective row are coupled by a different corresponding respective wire 219 on the sample 104. In some embodiments, the wires 219 are positioned and configured to couple to the components 214 within each row to one another on the sample 104.

In some embodiments, the component connectors 218 are positioned and configured to couple to the components 214 and component connectors 218 within each column are coupled to one another on the probe card 108 (e.g., are the signal lines 205 in FIG. 2A). In some embodiments, the connectors 110 shown in FIGS. 1A-1B include the row connectors 216, column connectors 217 and the component connectors 218.

Figure 2D:
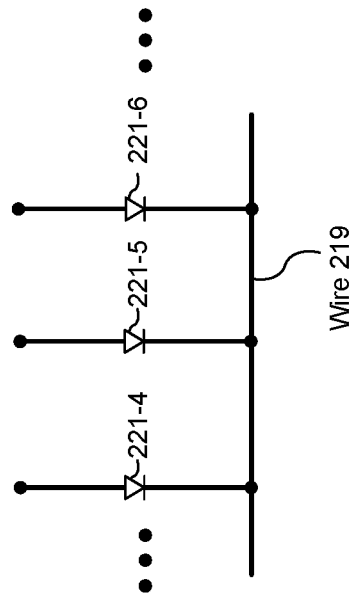
FIGS. 2C-2D illustrate examples of isolation devices, in accordance with some embodiments.
Figure 2C:
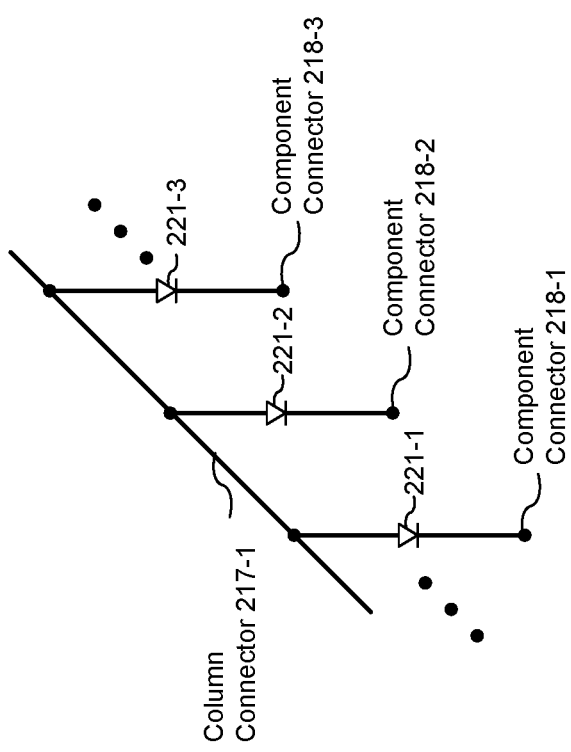

In some embodiments, as shown in FIGS. 2C-2D, component connectors 218 include an isolation device (e.g., a device, such a diode, with an asymmetric impedance (e.g., a different impedance between a first terminal and a second terminal of the impedance device as compared to the impedance between the second terminal and the first terminal of the impedance device)). In some embodiments, the isolation devices are included on the sample 104 rather than the component connectors 218. In some circumstances, when probing and/or testing a respective component 214, the isolation devices reduce or eliminate the effect of parallel conductive and/or resistive paths through other components 214, so that the respective component 214 is probed and/or tested in isolation.

FIGS. 2C-2D illustrate examples of isolation devices, in accordance with some embodiments. In particular, FIG. 2C illustrates that, in some embodiments, isolation devices 221 (e.g., isolation devices 221-1, 221-2, and 221-3) are positioned and/or fabricated within component connectors 218 (e.g., isolation devices 221 are components of the probe card 108). Alternatively, FIG. 2D illustrates that, in some embodiments, isolation devices 221 (e.g., isolation devices 221-4, 221-5, 221-6) are positioned and/or fabricated on the sample 104 (e.g., on each connection between a respective wire 219 and a respective component 214). Examples of cryogenically-suitable isolation devices are described in U.S. Provisional Application No. 62/906,680, filed Sep. 26, 2019, entitled, "Superconducting Device with Asymmetric Impedance," which, as noted above, is incorporated by reference in its entirety.

Figure 3:
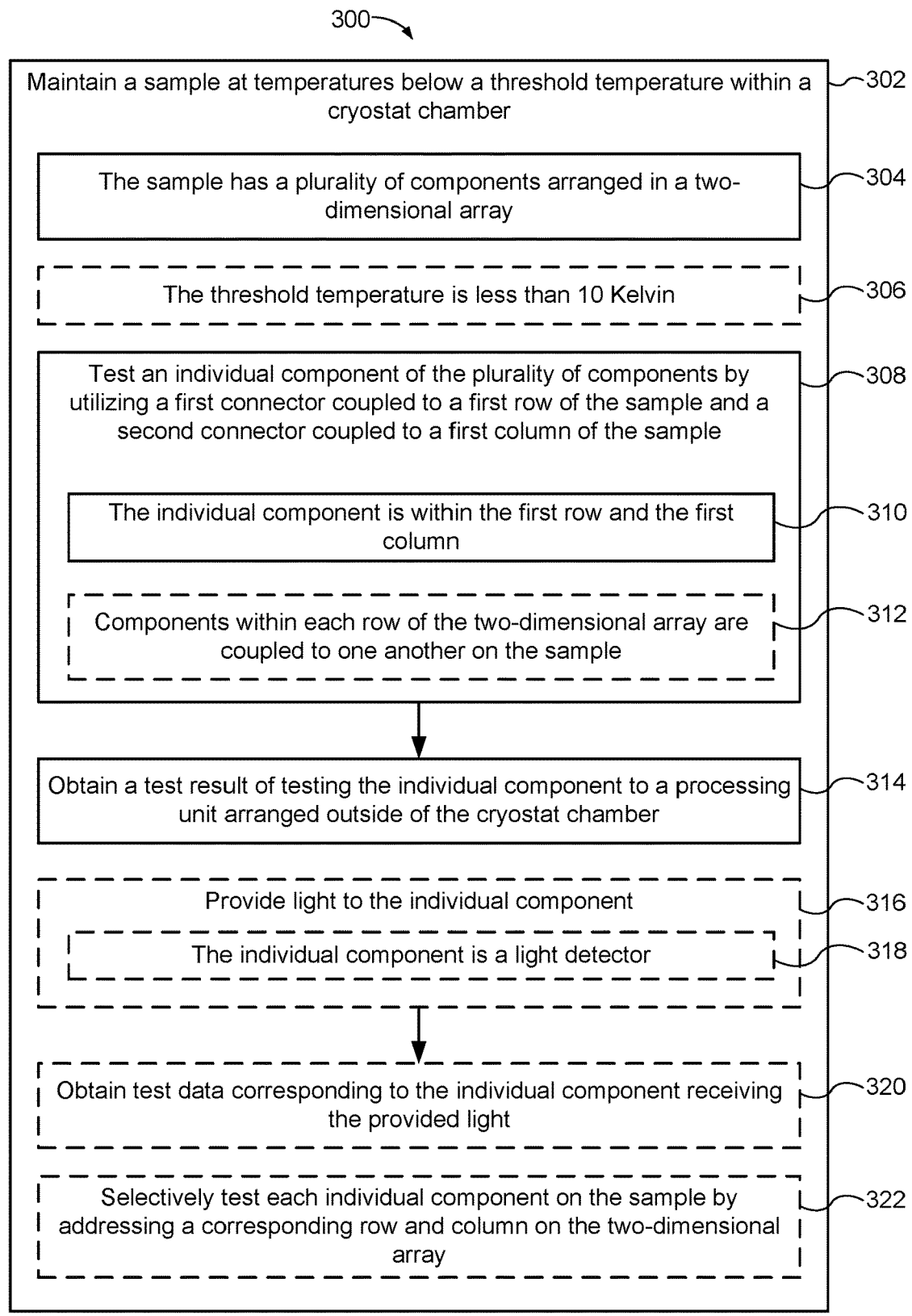
FIG. 3 is a flow diagram illustrating a representative method of testing a component at cryogenic temperatures in accordance with some embodiments.

FIG. 3 is a flow diagram illustrating a method 300 of testing a component (e.g., a component 202) at cryogenic temperatures in accordance with some embodiments. In some embodiments, the method 300 is performed within a cryogenic testing system (e.g., the testing system 100, FIG. 1A, or the testing system 120, FIG. 1B).

The testing system maintains (302) a sample (e.g., the sample 104) at temperatures below a threshold temperature (e.g., below 10 Kelvin or 4 Kelvin) within a cryostat chamber (e.g., the cryostat chamber 102, FIG. 1B). In some embodiments, the sample is maintained at temperatures below a threshold temperature by being thermally-coupled to a cryogen (e.g., via a mount 106 or 122). In accordance with some embodiments, the sample has (304) a plurality of components arranged in a two-dimensional array. For example, FIGS. 2A-2B show components arranged in two-dimensional arrays. In some embodiments, the threshold temperature is (306) less than 10 Kelvin (e.g., 4.5 Kelvin). In some embodiments, the sample is, or includes, a superconducting chip. In some embodiments, the sample is a silicon wafer (e.g., a 6, 8, or 13 inch wafer) with one or more superconducting chips thereon.

In some embodiments, the sample includes a two-dimensional array of components to be tested, the two-dimensional array comprising a first number (n) of columns and a second number (m) of rows. In some embodiments, the testing system includes: (1) a cryostat chamber configured to maintain the sample at temperatures below a threshold temperature; (2) a probe card including: (a) a set of n column connectors (e.g., column connectors 217, FIGS. 2B-2C) configured to couple to respective columns of the two-dimensional array; and (b) a set of m row connectors (e.g., row connectors 216, FIG. 2B) configured to couple to respective rows of the two-dimensional array; and (3) a cryogenic connector (e.g., feed-through 112) for communicatively coupling the probe card to a processing unit (e.g., control system 116) outside of the cryostat chamber. In some embodiments, the probe card is configured to: (i) selectively test individual components on the sample via row and column multiplexing; and (ii) output readout data to the processing unit via the cryogenic connector. In some embodiments, the cryogenic connector has less than n×m communication lines breaching the cryostat chamber.

In some embodiments, the probe card is configured to test (e.g., readout) the sample without use of transistors or active switches (e.g., multiplexing of the probe card is controlled by the control system and/or the connector). In some embodiments, the probe card is configured to output readout data from a sequence of the individual components on the sample without use of moving parts (e.g., utilizing the multiplexing schemes shown in FIGS. 2A-2B).

In some embodiments, the testing system includes the processing unit (e.g., within the control system 124, FIG. 1B); and the processing unit is configured to selectively test the individual component on the sample by addressing a corresponding row and column on the two-dimensional array. In some embodiments, the probe card is configured to readout the sample without use of active switches. For example, the processing unit activates specific connectors of the probe card for each individual test so that cryogenic switching is not necessary (e.g., activates a specific combination of row and column connectors to address an individual component).

While maintaining the temperature below the threshold temperature, the testing system tests (308) an individual component of the plurality of components (e.g., component 214-1, FIG. 2B) by utilizing a first connector (e.g., a row connector 216) coupled to a first row of the sample and a second connector (e.g., a column connector 217) coupled to a first column of the sample, where the individual component is (310) within the first row and the first column.

In some embodiments, components within each row of the two-dimensional array are (312) coupled to one another on the sample. For example, FIG. 2B shows each row of components 214 coupled to one another via a signal line (e.g., a signal line 203, FIG. 2A). For example, a reference node (e.g., a ground) for each component is coupled to corresponding reference nodes of other components in the row. In some embodiments, components within each column of the two-dimensional array are coupled to one another on the sample (e.g., via a signal line 205, FIG. 2A). In some embodiments, components within each column (or row) are coupled to one another on the probe card.

The testing system obtains (314) a test result of testing the individual component to a processing unit (e.g., the control system 124, FIG. 1B) arranged outside of the cryostat chamber. For example, the probe card 108 receives an output signal from the sample 104 via a connector 110 and relays the output signal (or information about the output signal) to the control system 124 via the communication lines 114 and the feed-through 112.

In some embodiments, the testing system provides (316) light to the individual component (e.g., via the optical source 126, FIG. 1B). In some embodiments, the individual component includes (318) a light-responsive element (e.g., is a photon detector or SNSPD). In some embodiments, the testing system obtains (320) test data corresponding to the individual component receiving the provided light, thereby testing the light-responsive element. In some embodiments, the testing system includes an optical source (e.g., the optical source 126). In some embodiments, the optical source is configured to provide light to each of the components of the sample without moving (e.g., without having movable probes). In some embodiments, the optical source and the probe card are controlled by a control system (e.g., the control system 124).

In some embodiments, the testing system includes a mount (e.g., the mount 122) for supporting (and optionally cooling) the sample. In some embodiments, the mount includes an aperture for the optical source. In some embodiments, the optical source includes a single optical fiber positioned and configured to convey light through the aperture to the components of the sample. In some embodiments, the optical source is configured to provide light to all of the light detectors (e.g., concurrently) and the probe card is configured to selectively readout data from individual components.

In some embodiments, the testing system selectively tests (322) each individual component on the sample by addressing a corresponding row and column on the two-dimensional array. For example, the testing system tests component 202-m in FIG. 2A by utilizing signal lines 205-1 and 203-m.

In some embodiments: (1) the two-dimensional array includes a first number (n) of columns and a second number (m) of rows; (2) the components within each row of the two-dimensional array are coupled to one another on the sample; (3) testing the individual component of the plurality of components includes utilizing a cryogenic probe card (e.g., the probe card 108, FIG. 1A) to test the individual component; and (4) the cryogenic probe card includes: (a) a set of n column connectors configured to couple to respective columns of the two-dimensional array; and (b) a set of m row connectors configured to couple to respective rows of the two-dimensional array.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, a "superconducting circuit" or "superconductor circuit" is a circuit having one or more superconducting materials. For example, a superconductor switch circuit is a switch circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also sometimes called herein a superconduction-capable material. In some embodiments, the superconducting materials operate in an "off" state where little or no current is present. In some embodiments, the superconducting materials can operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A cryogenic testing system, comprising:
   a cryostat chamber configured to maintain a sample at temperatures below a threshold temperature, wherein the sample includes a two-dimensional array of components to be tested, the two-dimensional array comprising a first number (n) of columns and a second number (m) of rows;
   a probe card, comprising:
      a set of n column connectors configured to couple to respective columns of the two-dimensional array; and
      a set of m row connectors configured to couple to respective rows of the two-dimensional array; and
   a cryogenic connector for communicatively coupling the probe card to a processing unit outside of the cryostat chamber;
   wherein the probe card is configured to:
      selectively test individual components on the sample via row and column multiplexing; and
      output readout data to the processing unit via the cryogenic connector; and
   wherein the cryogenic connector has less than n×m communication lines leaving the cryostat chamber.

2. The cryogenic testing system of claim 1, further comprising the processing unit, communicatively coupled by the cryogenic connector to the probe card; and
   wherein the processing unit is configured to selectively test the individual component on the sample by addressing a corresponding row and column on the two-dimensional array.

3. The cryogenic testing system of claim 1, wherein components within each row of the two-dimensional array are coupled to one another on the sample.

4. The cryogenic testing system of claim 1, wherein the components to be tested comprise a plurality of light detectors.

5. The cryogenic testing system of claim 4, further comprising an optical source configured to provide light to the plurality of light detectors within the cryostat chamber.

6. The cryogenic testing system of claim 5, wherein the optical source is configured to provide the light to the plurality of light detectors without use of a movable probe.

7. The cryogenic testing system of claim 5, further comprising a mount having a cold head within the cryostat chamber for mounting the sample, the mount including an aperture.

8. The cryogenic testing system of claim 7, wherein the optical source comprises a single optical fiber positioned and configured to convey light through the aperture to the plurality of light detectors.

9. The cryogenic testing system of claim 5, wherein the optical source is configured to provide light to all of the light detectors and wherein the probe card is configured to selectively readout data from individual light detectors of the plurality of light detectors.

10. The cryogenic testing system of claim 1, wherein the first number (n) is different than the second number (m).

11. The cryogenic testing system of claim 1, wherein the threshold temperature is less than 10 Kelvin.

12. The cryogenic testing system of claim 1, wherein the processing unit is maintained at temperatures above the threshold temperature.

13. The cryogenic testing system of claim 1, wherein the probe card is configured to output readout data from a sequence of the individual components on the sample without use of moving parts.

14. The cryogenic testing system of claim 1, wherein the probe card is configured to output readout data from the sample without use of active switches.

15. The cryogenic testing system of claim 1, wherein the sample comprises a superconducting chip.

16. A method, comprising:
- maintaining a sample at temperatures below a threshold temperature within a cryostat chamber, the sample having a plurality of components arranged in a two-dimensional array; and
- while maintaining the sample at the temperatures below the threshold temperature:
  - testing an individual component of the plurality of components by utilizing a first connector coupled to a first row of the sample and a second connector coupled to a first column of the sample, wherein the individual component is within the first row and the first column; and
  - outputting a test result of testing the individual component to a processing unit arranged outside of the cryostat chamber.

17. The method of claim 16, wherein the individual component comprises a light detector;
- the method further comprises providing light to the light detector; and
- wherein testing the individual component comprises obtaining test data corresponding to the light detector receiving the provided light.

18. The method of claim 16, wherein the sample comprises a superconducting chip.

19. The method of claim 16, wherein the two-dimensional array comprises a first number (n) of columns and a second number (m) of rows;
- wherein components within each row of the two-dimensional array are coupled to one another on the sample;
- wherein testing the individual component of the plurality of components comprises utilizing a cryogenic probe card to test the individual component; and
- wherein the cryogenic probe card comprises:
  - a set of n column connectors configured to couple to respective columns of the two-dimensional array; and
  - a set of m row connectors configured to couple to respective rows of the two-dimensional array.

\* \* \* \* \*